United States Patent
Palanisamy et al.

(10) Patent No.: US 6,885,167 B2
(45) Date of Patent: Apr. 26, 2005

(54) METHOD AND APPARATUS FOR DETERMINING COLD CRANKING AMPERES VALUE

(75) Inventors: Thirumalai G. Palanisamy, Morristown, NJ (US); William Hovey, Rockaway, NJ (US)

(73) Assignee: Honeywell International Inc., Morristown, NJ (US)

( * ) Notice: Subject to any disclaimer, the term of this patent is extended or adjusted under 35 U.S.C. 154(b) by 21 days.

(21) Appl. No.: 10/430,084

(22) Filed: May 6, 2003

(65) Prior Publication Data

US 2004/0222797 A1 Nov. 11, 2004

(51) Int. Cl.[7] ................................................. H02J 7/00
(52) U.S. Cl. ........................................................ 320/104
(58) Field of Search ................................. 320/104, 132, 320/106; 324/426–432; 702/63

(56) References Cited

U.S. PATENT DOCUMENTS

| | | | | | |
|---|---|---|---|---|---|
| 5,281,919 | A | * | 1/1994 | Palanisamy | 324/427 |
| 5,721,688 | A | * | 2/1998 | Bramwell | 702/63 |
| 6,384,608 | B1 | | 5/2002 | Namaky | |
| 6,469,512 | B1 | * | 10/2002 | Singh et al. | 324/426 |
| 6,618,681 | B1 | * | 9/2003 | Hoenig et al. | 702/63 |

* cited by examiner

*Primary Examiner*—Pia Tibbits
(74) *Attorney, Agent, or Firm*—Kurt Luther; James W. Falk

(57) ABSTRACT

A method and apparatus for determining the cold cranking ampere (CCA) value of a battery under test in which an algorithm of battery CCA as a function of battery internal resistance (IR) is provided, the IR of the battery under test is measured, and the measured IR determines the CCA value of the battery under test from the algorithm. The method and apparatus are used either in a vehicle in which the battery is installed or on a stand alone basis.

14 Claims, 3 Drawing Sheets

METHOD AND APPARATUS FOR DETERMINING COLD CRANKING AMPERES VALUE

FIELD OF THE INVENTION

This invention relates to a method and apparatus for determining the cold cranking ampere (CCA) value of a battery by measuring its internal resistance (IR).

BACKGROUND OF THE INVENTION

One parameter used in rating conventional automotive and other types of vehicle batteries is the cold cranking amperes (CCA). For a conventional automotive lead-acid storage battery, whose nominal voltage output is 12.6 V, CCA is a rating of the current (in amperes) that the battery can output for 30 seconds at a temperature of 0° C. with the battery voltage at or above 7.2 V. The CCA value relates to the capability of the battery for starting the vehicle. The most critical component of a vehicle that loads the battery is the vehicle starter motor. If the CCA is below a certain value, the starter will not turn over the vehicle motor for starting.

Accordingly, it would be desirable to know the CCA value of a battery already installed in a vehicle so as to be able to determine when the battery should be charged or replaced. A device manufactured by Midtronics of Burr Ridge, Ill. is available which measures battery CCA using an alternating current (AC) signal. This device is relatively expensive and complicated and requires that the battery be disconnected from the vehicle in order to determine its CCA value.

As seen, a need exists for a method and apparatus to determine the CCA value for a battery that is relatively inexpensive, easy to operate and can determine the CCA when the battery is installed in the vehicle without having to disconnect the battery. It also would be desirable to be able to provide a relatively inexpensive apparatus that can easily check the CCA value of a battery that is not installed in a vehicle, for example, where a battery is to be installed as a replacement or has been reconditioned.

BRIEF DESCRIPTIONS OF THE INVENTION

We have discovered that the internal DC resistance (IR) of a battery has a relationship to its CCA value. In a first part of the invention, an algorithm is developed which indicates the IR-CCA relationship. In a second part, the IR of a battery is determined, which can be done while the battery is in its operational environment installed in a vehicle or on a stand-alone basis in which the battery is out of the vehicle. The measured IR of the battery is then applied to the IR-CCA algorithm to determine the battery CCA value.

In a preferred implementation for carrying out the second part of the invention, an electronic circuit is used that includes a microprocessor or microcontroller having an associated, or on-board, memory in which the algorithm is stored. The microprocessor is provided with data of voltage (V) and current change (I) measured at two different points of battery operation, such as a change between two conditions of load placed on the battery or at times before and during a pulse of current applied to charge the battery or a discharge current pulse. From this data, which is stored in microprocessor memory, the microprocessor calculates the IR using the known formula $$IR = \frac{dV}{dI}.$$

Here, dV is the change in voltage and dI is the change in current between the two measuring points as calculated by the microprocessor from the stored V and I data values. The calculated value of IR is then applied to the algorithm and the CCA rating of the battery is determined. This value can be displayed.

A preferred embodiment of the circuit of the invention is incorporated directly in the vehicle as part of its instrumentation and the battery CCA value can be monitored continually, at periodic pre-set intervals, or on demand. In another embodiment, the circuit is used on a stand-alone basis to measure the CCA with the battery being in or out of the vehicle.

OBJECTS OF THE INVENTION

An object of the invention is to provide an apparatus and method to determine the CCA value of a battery.

A further object is to provide an apparatus and method for determining the CCA value of a battery installed in a vehicle without having to disconnect the battery from the vehicle operating system.

Still a further object is to provide a method and apparatus for determining the CCA value of a battery installed in a vehicle in which a measurement of the battery is made during its normal operation under load.

Yet an additional object is to provide a method and apparatus in which the CCA value of a battery can be determined in a relatively simple manner when the battery is either installed in a vehicle or is not installed.

Another object of the invention is to determine the CCA value of a battery by measuring its IR.

BRIEF DESCRIPTION OF THE DRAWINGS

Other objects and advantages of the present invention will become more apparent upon reference to the following specification and annexed drawings, in which.

DETAILED DESCRIPTION OF THE INVENTION

Figure 1:
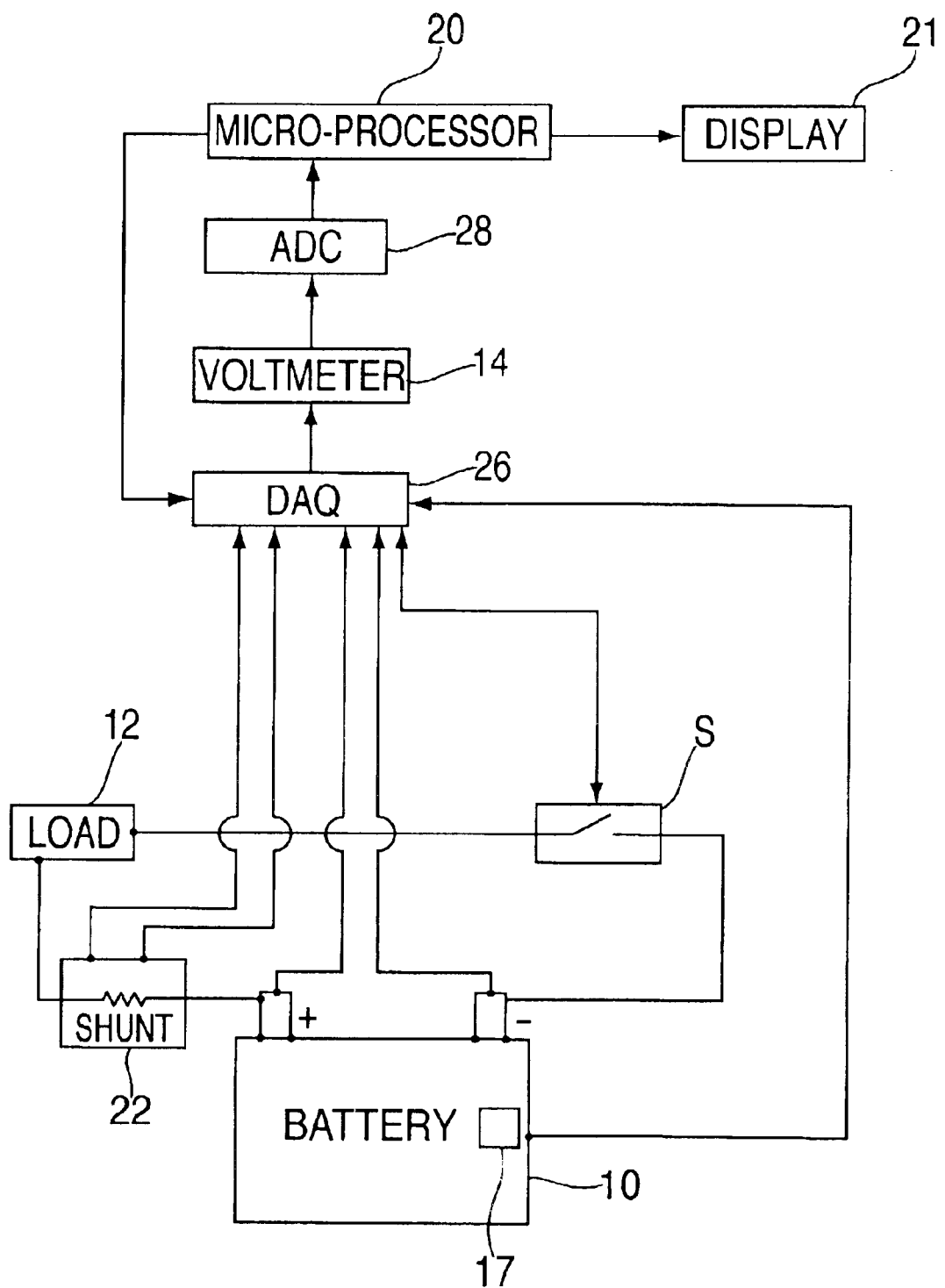
FIG. 1 is a schematic diagram of one embodiment of a circuit for carrying out the invention.

FIG. 1 shows a preferred embodiment of a circuit that can be used in a vehicle that contains the battery 10 whose CCA value is to be monitored and determined. The invention is illustratively described with reference to a lead-acid type storage battery that is commonly used in a vehicle. A load 12 is shown connected to one terminal of the battery 10 in series with a shunt (resistor) of known value 22. The vehicle load 12 is the usual starting, lighting and accessory (SLA) components of the vehicle, such as the starter, motor, lights, air conditioner, etc. The load changes as the vehicle undergoes different operating conditions.

In FIG. 1 there is a suitable conventional microprocessor or microcontroller 20. The microprocessor 20 has a memory in which is stored an application program having the necessary instructions to control performance of various measurements and calculation and comparison functions, as described below. The application program can be embedded in a read only memory (ROM) or in a suitable device such as a PROM that can be reprogrammed. The microprocessor 20 also includes the usual RAM type memory, data processing unit and computational facilities. It also has its own internal clock that interfaces with the application program. A display 21, which can be of the LED, LCD or audio type, is driven as an output of the microprocessor. Many vehicles already use such a microprocessor for various purposes, and the program of the invention can be incorporated so that a separate microprocessor would not be required. If desired, a data input device, e.g., a keyboard (not shown), can be provided to modify the microprocessor program.

A voltmeter 14 input is connected to the output of a data acquisition (DAQ) circuit 26. One of the inputs of the DAQ 26 is connected to the terminals of the vehicle battery 10 to measure its output voltage (V). Another DAQ input is also connected across the shunt 22, which can be a precision type resistor of a known value that is in series with the battery positive or negative terminal and through which the vehicle load current and the battery charge current flow. The current (D) is calculated by the microprocessor 20 from the voltage measured across the shunt 22. Any other suitable technique can be used to measure the current, for example, a Hall effect device.

A signal conditioner circuit (not shown) can be provided in the DAQ circuit 29 or the voltmeter 14. The DAQ circuit also is preferably connected to acquire temperature data from a sensor 17, such as a thermocouple, located at or on the battery to measure battery temperature.

The data acquisition circuit (DAQ) 26 is controlled by the microprocessor 20. During operation of the circuit of FIG. 1, a switch S is controlled by the DAQ 26 to open and close the charge load circuit by opening or closing the connection to the battery terminals. When the circuit of FIG. 1 is operated, the DAQ switches to connect internally the voltmeter 14 for making the voltage measurement across the battery terminals or the shunt resistor 22. The DAQ can be operated by the microprocessor to acquire the voltage data on a timed basis during operation when the vehicle is drawing a load current, e.g., once an hour, every 24 hours, operated on demand, or operated each time that the vehicle is started (measurements made before and after starting), etc. Temperature data from sensor 17 can be acquired at the same time. Operation can also be event driven, such as by sensing a temperature below a predetermined value.

The microprocessor either has one or more built in analog-to-digital converters (ADCs) 28 to convert the measured analog voltage quantities to digital values can also be a separate device, as depicted in FIG. 1. Alternatively, the leads from battery, shunt and other devices such as temperature sensor 17 can be directly connected to the ADCs. In such a case, the DAQ circuit may not be required.

The measured battery voltage (V) and voltage measured across the shunt 22, each an analog quantity, is converted to digital form by an analog-digital converter (ADC) 28, as is the temperature data from sensor 17, and the digital data of these parameters is supplied to microprocessor 20 where it is stored. The microprocessor calculates the current (I) from the voltage measured across the shunt resistor 22 and the known value of this resistor. The V and I values are stored in the microprocessor memory.

To determine the battery IR, the microprocessor 20 instructs the DAQ 26 to make measurements of the battery terminal voltage V and the voltage across the shunt 22, from which the current I is calculated, at two different times, for example, 1 to 10 seconds apart. The vehicle load current is never totally constant so the battery terminal voltage and shunt voltages measured at these times will be different. In the event the loads are substantially the same, additional measurements are taken until a difference in load occurs. The values of measured battery terminal voltage V and calculated current I at these two times are stored in microprocessor memory. From this stored data of V and I at the two different times, the microprocessor computes that battery IR from the formula $$IR = \frac{dV}{dI}.$$

The IR value is stored by the microprocessor and also can be displayed on the display 21 if desired. The acquired temperature data is used, if necessary, to adjust the IR to a reference level of a predetermined temperature, for example, 25° C.

Figure 2:
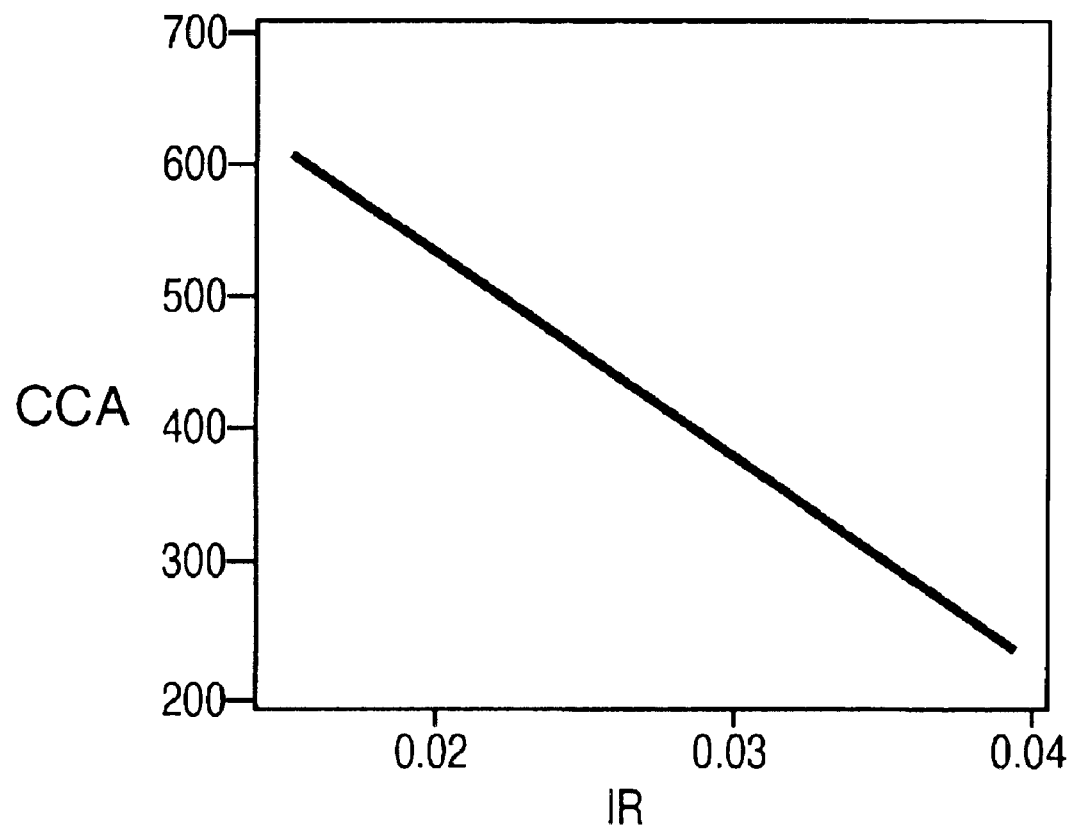
FIG. 2 is a graph of the IR-CCA algorithm.

FIG. 2 shows the relationship of battery CCA (vertical axis—in amperes) to IR (horizontal axis—in ohms). To develop this data, a plurality of new lead-acid storage batteries of different sizes, capacities, and from different manufacturers was obtained. Each battery had its own manufacturer designated CCA value and the batteries were individually tested to determine the battery IR at room temperature (25° C.). This can be done using the circuit of FIG. 1 in which the load was changed, such as by adding or substituting a resistance in the load circuit 12. Any other suitable known technique, or circuit for measuring battery IR can be used, such as by applying a pulse of current of a known value (dI) from a suitable current source to the battery and measuring the terminal voltage change (dV).

It should be understood that many varieties of batteries are manufactured having different capacities rated in ampere hours (Ah). There is a general relationship of CCA to battery capacity of automotive batteries. That is, the higher the Ah rating, the higher will be the CCA rating. Also, as is known, as a battery ages, its IR increases nd its capacity (Ah) decreases, meaning that its CCA value should also decrease.

The known data of rated CCA and acquired data of measured IR at room temperature for the various batteries tested was plotted for use in a computer program. Then, a regression analysis was performed on this data, for example by the Microsoft Excel computer program. The regression analysis equation yields the general result of the CCA being inversely related to the battery IR at room temperature. This is an empirical relationship given by the general equation:

$$CCA = k_1 - k_2 IR \tag{1}$$

where each of $k_1$ and $k_2$ is a constant.

From the data measured for lead-acid storage batteries, the algorithm equation is:

$$CCA = 832.944 - 15127.8 IR \tag{2}$$

In a preferred embodiment, the data of equation (2) is programmed into the memory of microprocessor 20.

In use of the circuit of FIG. 1, the IR of the battery under test is determined, as described above. As indicated, the algorithm equation depicted in FIG. 2 was derived with the batteries at a temperature of 25° C. If the IR of a battery under test is measured at a temperature other than 25° C., then a correction should be made to assure accuracy of the CCA determination. To do this, the measurement of temperature acquired from sensor 17 is used in the microprocessor to calculate the battery IR referenced to 25° C., such as by using the methodology described in U.S. Pat. No. 4,937,528, assigned to the present assignee, the disclosure of which is incorporated herein in its entirety for reference. The algorithm to make this correction, as described in this patent is stored in the microprocessor 20. The value of the measured IR adjusted to 25° C. is stored. It should be understood that if the IR determination is made with the battery under test at 25° C., then no adjustment is needed.

The microprocessor 20 makes the calculation to determine the CCA value by adjusting the IR calculated at the battery's actual temperature to the IR as it should be at 25° C. The adjusted IR value is applied to the stored algorithm representation of FIG. 2 to determine the CCA value which can be displayed by the display 21. As an alternative, the data points of IR related to CCA for the various batteries can be programmed into the microprocessor memory in the form of a look-up table. The stored value of the IR of the battery under test is then applied against the data of the look-up table to determine the CCA. This IR value can be temperature adjusted, if necessary, and the CCA determined from FIG. 2 is displayed on the display 21.

Figure 3:
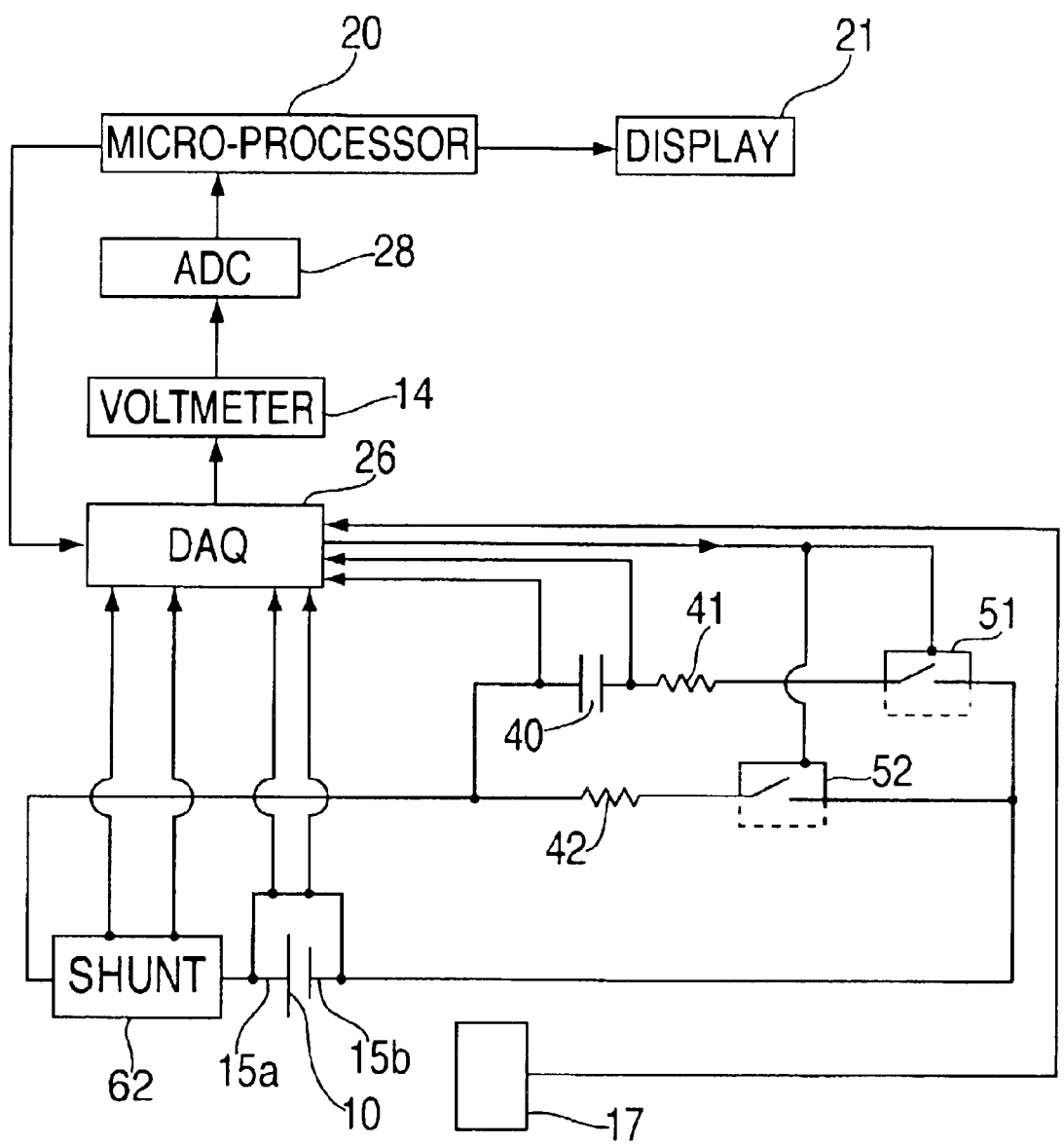
FIG. 3 is a schematic diagram of an alternative form of a circuit for implementing the invention.

FIG. 3 is a schematic diagram of an embodiment of a circuit that can be used as a stand-alone unit, that is, for example, as a hand-held unit or mounted as part of a shop test system. The unit is powered by its own internal battery or an AC line power source from a wall outlet (not shown). The circuit of FIG. 3 can be used with the battery under test either installed in the vehicle or out of the vehicle. The same components used in this circuit that are used in the circuit of FIG. 1 have the same reference numbers. Here, the unit has leads 15a, 15b built in as part of a device that are to be attached to the battery 10 terminals, such as by spring clips. The unit also has its own precision shunt resistor 62, preferably connected in series with the one of the voltmeter leads, illustratively lead 15a. Where the circuit is to be used to test the CCA of a battery installed in a vehicle, the shunt resistor 62 is connected in series with one of the battery cables. If the resistance of the battery cable is known, then it can be used as the shunt to acquire the voltage data to compute the current (I).

To operate the unit, the leads 15 are connected to the battery terminals. The unit is then turned on. The DAQ 26 is operated by the microprocessor 20 to measure the battery terminal voltage V that is converted to digital form by the ADC 28 and then stored in computer memory. The voltage across shunt 62 is next measured from which the current I is calculated and stored in the manner explained above.

Connected across the battery positive and negative terminals is a first branch circuit formed by a series connection of a capacitor 40, resistor 41 and switch 51. A second branch circuit formed by a series connected resistor 42 and switch 52 is connected in parallel with the first branch circuit. The switches 51 and 52 which can be diodes, are operated by the DAQ 26 under control of the microprocessor 20. When the two switches are both open, the branch circuits have no effect. The capacitor 40 gets charged by its own power source, either a battery to it or from a DC voltage converted from the AC line (not shown).

When the unit is turned on, the DAQ opens switch 51 and switch 52 and allows the capacitor 40 to be charged by its power source. When a battery test is started, the unit can perform a charge pulse test or a discharge pulse test, depending on the battery condition. To perform a charge pulse test the unit disconnects the capacitor 40 from its power source, closes switch 51 while keeping the switch 52 open for a short duration. This allows the unit to impart a controlled charge pulse current into the battery. The circuit measures the voltage and current at times both prior to and during this discharge. By using the equation $$IR = \frac{dV}{dI},$$

the dV being the voltage difference between, before the start of the pulse and during this pulse and dI being the difference between the current between before the start of the pulse and during the pulse, the IR is calculated. If necessary, the measured IR is temperature adjusted to the IR at 25° C. in accordance with the temperature data acquired by sensor 17, as described above.

The unit generally uses a discharge pulse except when the state of charge (SOC) of the battery is below 20%. Battery SOC is determined by any suitable method, such as that described in the aforementioned patent U.S. Pat. No. 4,937,528. The SOC value can be stored in the microprocessor or the unit manually operated based on the SOC. In the case where the state of charge is above 20%, a discharge pulse is normally used, as directed by the microprocessor. To send a discharge pulse through the battery, the microprocessor operates DAQ 26 to close switch 52 and open switch 51 for a short duration. This allows the battery to discharge through a load resistor 42. The IR is determined as described above. When the state of charge is lower than a predetermined value, it will be adjusted to calculate the IR at 100% SOC. This can be done by the method described in the aforementioned patent. The adjusted IR value is used to determine the CCA of a battery using the algorithm of FIG. 2. Alternatively, the battery may be charged to 100% SOC, and IR determined again. In either case, the temperature adjustment also can be applied as described above.

If the unit is equipped with an internal battery (not shown), the battery should be capable of charging the capacitor 40 to a voltage greater than 14V, which is a voltage higher than that of a normal fully charged car battery. The capacitor is of a value such that enough charge is stored to be able to impose a charge pulse into the battery preferably lasting at least about one second. The microprocessor measures the current and voltage both before and during the pulse and calculates the IR and computes the CCA in the manner described above.

Additional circuits may be incorporated in the unit to provide a constant current charge pulse, although this is not critical. Also, the resistors 41 and 42 may be variable resistors to provide the desired current levels of the pulses.

Specific features of the invention are shown in one or more of the drawings for convenience only, as each feature may be combined with other features in accordance with the invention. Alternative embodiments will be recognized by those skilled in the art and are intended to be included within the scope of the claims.

We claim:

1. A method for determining the cold cranking ampere (CCA) value of a battery under test comprising the steps of:
    computing and storing an algorithm of battery CCA as a function of battery internal resistance (IR);
    measuring the IR of the battery under test; and
    using the measured IR determining the CCA value of the battery under test from the stored algorithm.

2. A method as set forth in claim 1 wherein the step of computing the algorithm comprises:
    measuring the IR value of each of a plurality of batteries of different types having different rated CCA values;
    plotting the measured IR value of each battery relative to its respective rated CCA value; and analyzing the IR values relative to the known rated CCA values to produce the algorithm.

3. A method as set forth in claim 2 wherein the CCA rating is the value rated by the manufacturer of the respective battery.

4. A method as set forth in claim 1, wherein the algorithm determined is $CCA=k_1-k_2 IR$ where each of $k_1$ and $k_2$ is a constant.

5. A method as set forth in claim 4 wherein the battery under test is a lead-acid storage battery and the algorithm determined is $CCA=832.944-15127.8\ IR$.

6. A method as set forth in claim 1 wherein the step of measuring the IR of the battery under test comprises:
   measuring the change in terminal voltage of the battery at the two different points of time (dV) and the change of the current at the two different points of time (dI) and computing the IR of the battery under test as $$IR = \frac{dV}{dI}.$$

7. The method of claim 1 further comprising the steps of:
   providing an algorithm that adjusts IR in relation to a reference temperature;
   measuring the temperature of the battery under test; and
   adjusting the measured IR on the basis of the measured temperature for use in determining the CCA value from the IR:CCA algorithm.

8. The method of claim 1 further comprising the steps of:
   providing data to adjust the IR of the battery under test in relation to the state of charge of the battery;
   measuring the state of charge of the battery under test; and
   adjusting the measured IR on the basis of the measured state of charge for use in determining the CCA value from the IR:CCA algorithm.

9. Apparatus for determining the cold cranking amperes (CCA) value of a battery under test comprising:
   a computer having a memory in which is stored an algorithm relating CCA to battery internal resistance (IR) of batteries; and
   circuit means for acquiring voltage and current data from the battery under test to enable the IR to be calculated, wherein said computer calculates IR of the battery under test and uses the calculated IR with the stored algorithm to determine the CCA value of the battery under test.

10. Apparatus as in claim 9 wherein the battery under test is in an operating vehicle and said circuit means measures the change in terminal voltage of the battery at the two different points of time (dV) and the change of the current at the two different points of time (dI) and
   computing the IR of the battery under test as $$IR = \frac{dV}{dI}.$$

11. Apparatus as in claim 9 wherein said circuit means includes:
   means connected to the battery under test to apply a current pulse;
   means to connect to the battery terminals to acquire voltage data and current data at each of the times prior to and during the application of the current pulse to provide data to measure the change in terminal voltage of the battery at the two different points of time (dV) and the change of the current at the two different points of time (dI) and computing the IR of the battery under test as $$IR = \frac{dV}{dI}.$$

12. Apparatus as in claim 11 wherein the current pulse is a discharge pulse when the state of charge of the battery is above a predetermined value and a charge pulse when the battery state of charge is below said predetermined value.

13. Apparatus as in claim 9 further comprising sensor means for sensing the temperature of the battery under test and wherein the calculated IR is adjusted based on the measured temperature.

14. Apparatus as in claim 9 further comprising means for determining the state of charge of the battery under test and wherein the calculated IR is adjusted based on the determined state of charge.

* * * * *